US012770663B2

(12) United States Patent
Mohanty et al.

(10) Patent No.: US 12,770,663 B2
(45) **Date of Patent: *Oct. 20, 2026**

(54) SEMICONDUCTOR MEMORY DEVICE WITH CONTROLLED BIT LINE PRE-CHARGING AND METHOD OF OPERATING THE SAME

(71) Applicant: Taiwan Semiconductor Manufacturing Company, Ltd., Hsinchu (TW)

(72) Inventors: Shiba Mohanty, Hsinchu (TW); Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 130 days.

This patent is subject to a terminal disclaimer.

(21) Appl. No.: 18/739,554

(22) Filed: Jun. 11, 2024

(65) Prior Publication Data

US 2024/0331750 A1 Oct. 3, 2024

Related U.S. Application Data

(63) Continuation of application No. 17/749,228, filed on May 20, 2022, now Pat. No. 12,033,719.

(60) Provisional application No. 63/300,338, filed on Jan. 18, 2022.

(51) Int. Cl.
*G11C 7/12* (2006.01)
*G11C 7/14* (2006.01)

(52) U.S. Cl.
CPC . *G11C 7/12* (2013.01); *G11C 7/14* (2013.01)

(58) Field of Classification Search
CPC ........................................................ G11C 7/12
See application file for complete search history.

(56) References Cited

U.S. PATENT DOCUMENTS

| | | | | |
|---|---|---|---|---|
| 9,236,097 | B2 | 1/2016 | Sugamoto | |
| 10,446,201 | B2 | 10/2019 | Goel et al. | |
| 2002/0097623 | A1 * | 7/2002 | Suzuki .................. | G11C 7/227 365/210.1 |

(Continued)

FOREIGN PATENT DOCUMENTS

| | | | |
|---|---|---|---|
| CN | 103226970 | A | 7/2013 |
| CN | 111354400 | A | 6/2020 |

(Continued)

OTHER PUBLICATIONS

Korean Office Action; Appl. No. 10-2022-0080206; dated Oct. 30, 2023.

(Continued)

*Primary Examiner* — Hoai V Ho
(74) *Attorney, Agent, or Firm* — Jones Day

(57) ABSTRACT

A semiconductor device includes a memory bank. The memory bank includes a plurality N of memory arrays and a local control circuit. Each memory array includes a plurality of bit cells configured to store bits of information and connected between a plurality of bit lines and a plurality of complement bit lines. The local control circuit is configured to pre-charge the bit lines and the complement bit lines at most N−1 memory array at a time. A method of operating the semiconductor device is also disclosed.

20 Claims, 10 Drawing Sheets

(56) References Cited

U.S. PATENT DOCUMENTS

| | | | | |
|---|---|---|---|---|
| 2005/0122812 | A1* | 6/2005 | Song | G11C 7/06 365/205 |
| 2007/0008771 | A1 | 1/2007 | Lee et al. | |
| 2008/0106960 | A1* | 5/2008 | Goetz | G11C 7/12 365/203 |
| 2013/0194859 | A1 | 8/2013 | Liaw | |
| 2017/0110164 | A1 | 4/2017 | Cheng et al. | |
| 2020/0202948 | A1 | 6/2020 | Okuyama et al. | |
| 2020/0302997 | A1* | 9/2020 | Su | G11C 11/419 |

FOREIGN PATENT DOCUMENTS

| | | |
|---|---|---|
| JP | 2021163511 | 10/2021 |
| KR | 100256226 | 5/2000 |
| KR | 20000031427 | 6/2000 |
| TW | 202046305 | 12/2020 |
| TW | 202143225 | 11/2021 |

OTHER PUBLICATIONS

Taiwan Office Action; Appl. No. 111148431; dated Dec. 26, 2023.
Korean Office Action; Application No. 10-2022-0080206; Dated Aug. 26, 2024.
Chinese Office Action; Application No. 202210921532.3; Dated Apr. 28, 2026.

* cited by examiner

SEMICONDUCTOR MEMORY DEVICE WITH CONTROLLED BIT LINE PRE-CHARGING AND METHOD OF OPERATING THE SAME

CROSS-REFERENCE TO RELATED APPLICATIONS

This application is a continuation of U.S. patent application Ser. No. 17/749,228, filed May 20, 2022, which claims priority to U.S. Provisional Application No. 63/300,338, filed Jan. 18, 2022, the contents of which are incorporated herein by reference in its entirety.

BACKGROUND

A memory device includes a plurality of bit cells that store bits of information and that are connected between bit lines and complement bit lines. Prior to read/write operation on the memory device, the bit lines and the complement bit lines are pre-charged, e.g., to a supply voltage or a fraction of the supply voltage, thereby improving read/write access to the bit cells.

BRIEF DESCRIPTION OF THE DRAWINGS

Aspects of the present disclosure are best understood from the following detailed description when read with the accompanying figures.

DETAILED DESCRIPTION

Figure 1:
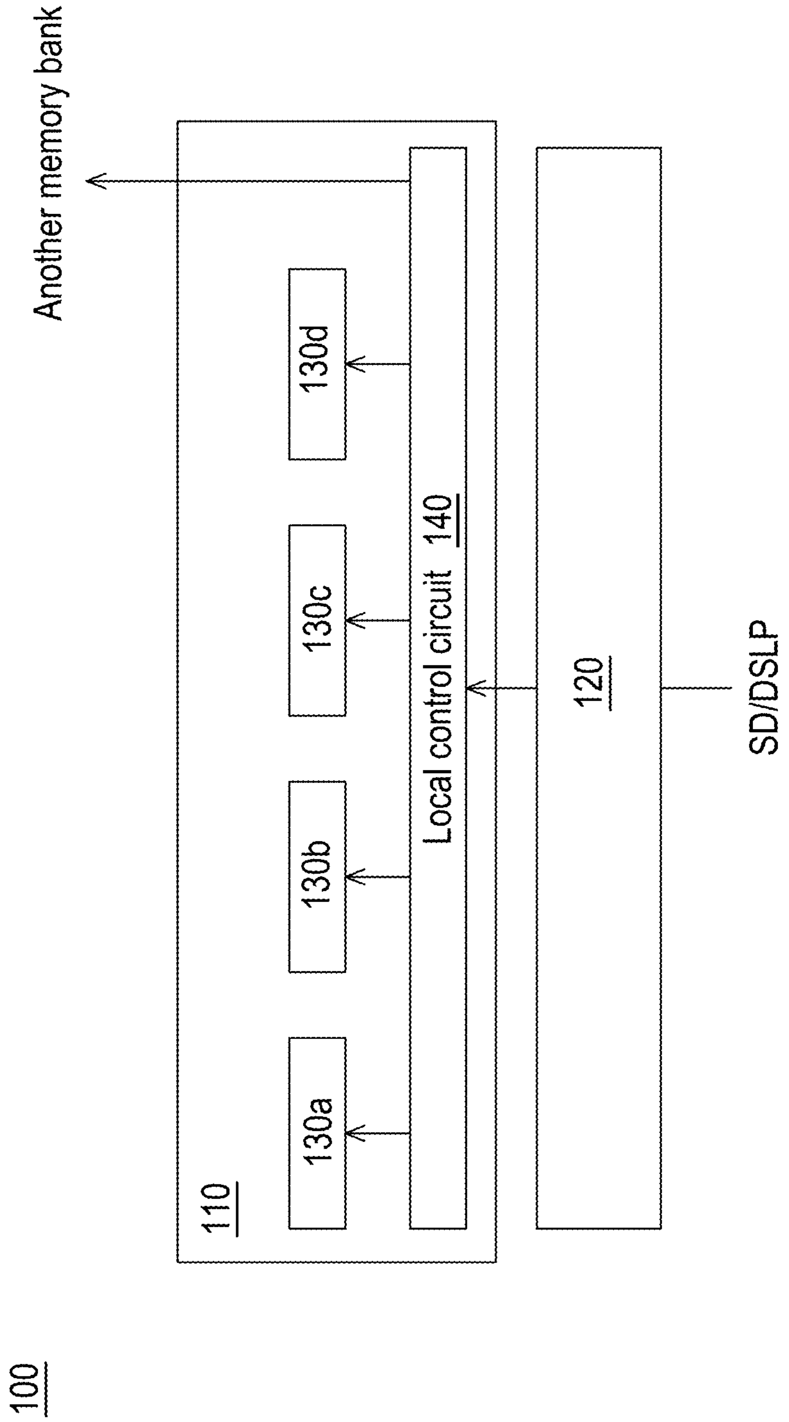
FIG. 1 is a schematic diagram illustrating an exemplary semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In an exemplary embodiment, a semiconductor device (e.g., semiconductor device 100 of FIG. 1) includes one or more memory banks (e.g., memory bank 110). The memory bank 110 includes a plurality of memory arrays (e.g., memory arrays **130*a*-130*d*). Each memory array 130*a*-130*d* includes a plurality of bit cells that store bits of information/data. The bit cells may be arranged in an array of rows and columns. The bit cells in each column are connected between a respective bit line and a respective complement bit line. During transition of the semiconductor device 100 from a shutdown (SD) mode or a deep sleep (DSLP) mode to a wake-up mode, the bit lines and the complement bit lines of the memory arrays 130*a*-130*d* may be pre-charged at the same time or at substantially the same time. Such a pre-charging may cause the semiconductor device 100** to undesirably generate a high peak current.

System and methods, in certain embodiments, as described herein reduce a peak current generated by the semiconductor device 100 during transition thereof from the SD/DSLP mode to the wake-up mode. Such a reduction in peak current may be achieved by pre-charging the bit lines and the complement bit lines one memory array at a time. In further detail, FIG. 1 is a schematic diagram illustrating an exemplary semiconductor device 100 in accordance with various embodiments of the present disclosure. As illustrated in FIG. 1, the semiconductor device 100, e.g., a single-port multi-bank (SPMB) memory device or any suitable memory device, includes a plurality of memory banks 110 (only one of the memory banks 110 is shown in FIG. 1) and a global control circuit 120. The memory banks 110 and the global control circuit 120 constitute a memory macro.

The memory bank 110 includes a plurality of memory arrays **130*a*-130*d*, e.g., static random access memory (SRAM) arrays, dynamic random access memory (DRAM) arrays, or any suitable memory arrays. Each memory array 130*a*-130*d*** includes a plurality of bit cells that store bits of information. In one or more embodiments, the bit cells are arranged in an array of rows and columns. In such one or more embodiments, the bit cells in each column are connected between a respective bit line and a respective complement bit line.

The memory bank 110 further includes a local control circuit configured to pre-charge the bit lines and the complement bit lines one memory array at a time. For example, during transition of the semiconductor device 100 from a SD/DSLP mode to a wake-up mode, the global control circuit 120 receives a SD/DSLP signal that has, e.g., a low logic level, and in response thereto, generates a global control signal that transitions, e.g., from a high logic level to a low logic level. The local control circuit 140 generates a pre-charge signal, e.g., pre-charge signal 290*a*, 290*e*, 290*i*, 290*m* in FIG. 5, that is based on the global control signal. For example, a high to low logic level transition in the global control signal causes a corresponding high to low logic level transition in the pre-charge signal. The pre-charge signal pre-charges the bit lines and the complement bit lines of the memory arrays 130*a*-130*d*. The local control circuit 140 introduces delays to the pre-charge signal such that pre-charging of the bit lines and the complement bit lines of a memory array is completed or substantially completed prior to pre-charging of the bit lines and the complement bit lines of another memory array. In this way, the bit lines and the complement bit lines are pre-charged one memory array at a time and whereby the semiconductor device 100 of the present disclosure generates a peak current lower than (e.g., less than 50%) a peak current generated by a conventional semiconductor device (in which the bit lines and the complement bit lines of all the memory arrays are pre-charged at the same time or at substantially the same time), during transition thereof from a SD/DSLP mode to a wake-up mode.

Figure 2:
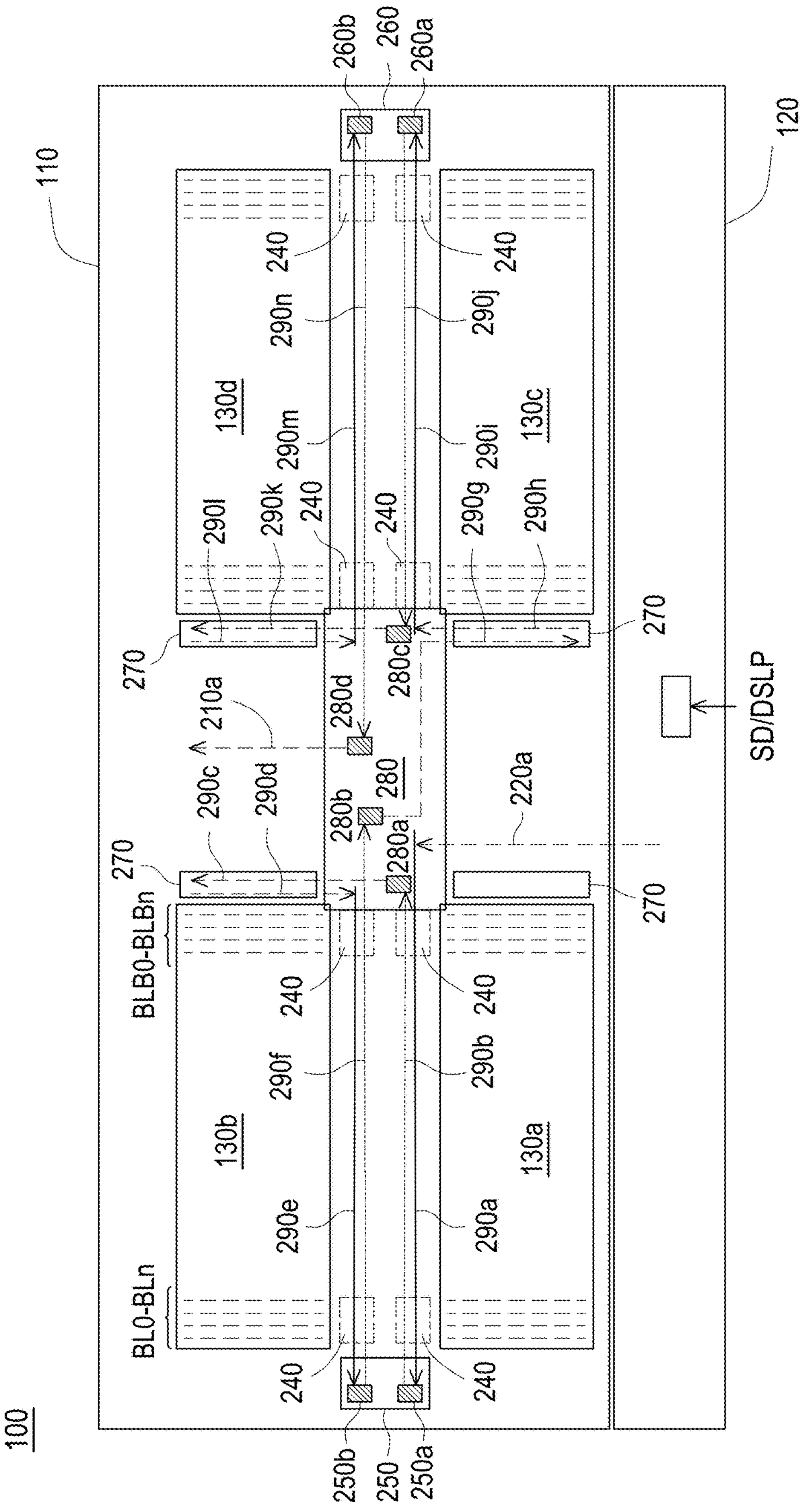
FIG. 2 is a schematic diagram illustrating the semiconductor device of FIG. 1 in accordance with various embodiments of the present disclosure.

FIG. 2 is a schematic diagram illustrating the semiconductor device 100 in accordance with various embodiments of the present disclosure. As illustrated in FIG. 2, the semiconductor device 100, e.g., a SPMB memory device or any memory device, includes a plurality of memory banks 110 (only one of the memory banks 110 is shown in FIG. 2) and a global control circuit 120. In an alternative embodiment, the semiconductor device 100 includes a single memory bank. The memory bank 110 includes a plurality of memory arrays (e.g., memory array 130*a*, memory array 130*b* above the memory array 130*a*, memory array 130*c* at the right side of the memory array 130*a*, and memory array 130*d* above the memory array 130*c* and at the right side of the memory array 130*b*). Each memory array 130*a*-130*d* includes a plurality of bit cells, e.g., bit cell 300 of FIG. 3, that store bits of information/data. In one or more embodiments, the bit cells 300 are arranged in an array of rows and columns. In such one or more embodiments, the bit cells 300 in each column are connected between a respective bit line (BL0-BLn) and a respective complement bit line (BLB0-BLBn).

Although the memory bank 110 is exemplified with four memory arrays 130*a*-130*d*, it is understood that, after reading this disclosure, the number of memory arrays of the memory bank 110 may be increased or decreased.

The memory bank 110 further includes a plurality of pre-chargers 240. Each pre-charger 240 is connected between a respective bit line (BL0-BLn) and a respective complement bit line (BLB0-BLBn). The pre-charger 240 is configured to pre-charge the bit line (BL0-BLn) and the complement bit line (BLB0-BLBn), e.g., to a supply voltage or a fraction of the supply voltage, thereby improving read/write access to the bit cells 300. For example, the bit line (BL) and the complement bit line (BL) may be pre-charged to a common voltage, such as ½ way between “0” and “1”. As such, when the bit cell 300 is read/written, the bit line (BL)/complement bit line (BLB) may only need to be driven from the common voltage to either “0” or “1”. This results in about half the transition time.

As illustrated in FIG. 2, the memory bank 110 further includes a plurality of dummy bit cell circuits 270. Each dummy bit cell circuit 270 is adjacent a respective memory array 130*a*-130*d* and is connected between a respective dummy bit line (DBL) and a respective dummy complement bit line (DBLB). In certain embodiments, the number of dummy bit cells, e.g., dummy bit cell 400 of FIG. 4, in each dummy bit cell circuit 270 is equal to the number of bit cells 300 in a column. The dummy bit line (DBL) of each dummy bit cell circuit 270 is connected to the pre-chargers 240 of a respective memory array 130*b*-130*d*.

The memory bank 110 further includes a local control circuit that has a left local input/output (I/O) edge 250 and a right local I/O edge 260 and a local controller 280 between the left and right local I/O edges 250, 260. The left and right local I/O edges 250, 260 isolate the local control circuit from auxiliary circuitry of the semiconductor device 100 outside the memory macro. In this exemplary embodiment, each of the left and right local I/O edges 250, 260 is formed with a pair of buffer circuits 250*a*, 250*b*, 260*a*, 260*b*. In some embodiments, at least one of the buffer circuits 250*a*, 250*b*, 260*a*, 260*b* is in the form of a pair of inverters connected in series. Other configurations for the buffer circuit 250*a*, 250*b*, 260*a*, 260*b* are contemplated in further embodiments. The input of each buffer circuit 250*a*, 250*b*, 260*a*, 260*b* is connected to the pre-chargers 240 of a respective memory array 130*a*-130*d*.

As illustrated in FIG. 2, the local controller 280 is connected to the pre-chargers 240 of the memory array 130*a* and thus to the input of the buffer circuit 250*a*. In this exemplary embodiment, the local controller 280 is formed with two pairs of buffer circuits 280*a*-280*d*. In some embodiments, at least one of the buffer circuits 280*a*-280*d* is in the form of a pair of inverters connected in series. Other configurations for the buffer circuit 280*a*-280*d* are contemplated in further embodiments. The input of each buffer circuit 280*a*-280*d* is connected to the output of a respective buffer circuit 250*a*, 250*b*, 260*a*, 260*d*. The output of each buffer circuit 280*a*-280*c* is connected to the dummy bit line (DBL) of a respective memory array 130*b*-130*d*. The output of the buffer circuit 280*d* is connected to another memory bank.

The global control circuit 120 controls reading from and writing to the bit cells 300. In some embodiments, during transition of the semiconductor device 100 from a SD/DSLP mode to a wake-up mode, the global control circuit 120 receives, e.g., a low logic level SD/DSLP signal, and in response thereto, generates a global control signal 220*a* that pre-charges the bit lines (BL0-BLn) and the complement bit lines (BLB0-BLBn) of the memory bank 110, in a manner that will be described below.

Figure 3:
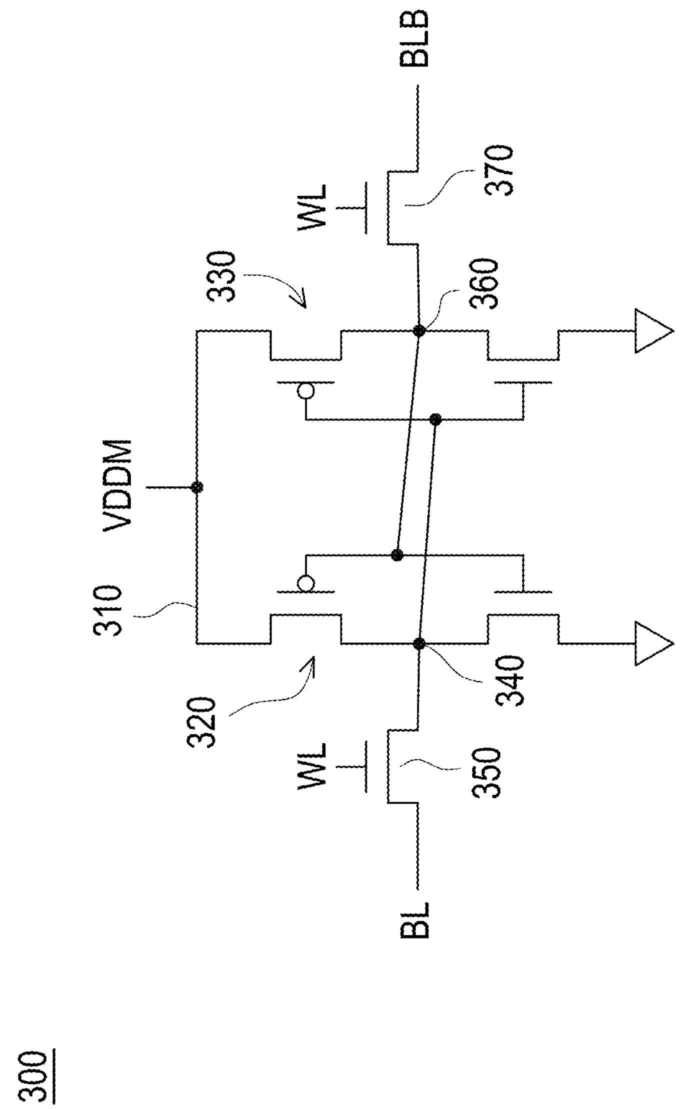
FIG. 3 is a schematic diagram illustrating an exemplary bit cell of a semiconductor device in accordance with various embodiments of the present disclosure.

Example supporting circuitry for the bit cell 300 are depicted in FIG. 3. It is understood that these circuitry are provided by way of example, not by limitation, and other suitable bit cell 300 circuitry are within the scope of the present disclosure. FIG. 3 is a schematic diagram illustrating an exemplary bit cell 300 of the semiconductor device 100 in accordance with various embodiments of the present disclosure. As illustrated in FIG. 3, the example bit cell 300 is a 6T (six transistor) bit cell. While a 6T bit cell 300 is shown in this example, other types of bit cells such as an 8T, 10T, or others may be used in other examples. The example bit cell 300 includes a supply voltage node 310 configured to receive a supply voltage (VDDM). The supply voltage node 310 is connected to cross-coupled inverters 320, 330. A data node 340 is connected between an output of the cross-coupled inverter 320 and a first pass device 350 driven by a word line (WL). A complement data node 360 is connected between an output of the cross-coupled inverter 330 and a second pass device 370 driven by the word line (WL). The bit line (BL) is connected to the data node 240 through the first pass device 350. The complement bit line (BLB) is connected to the complement data node 360 through the second pass device 370.

Figure 4:
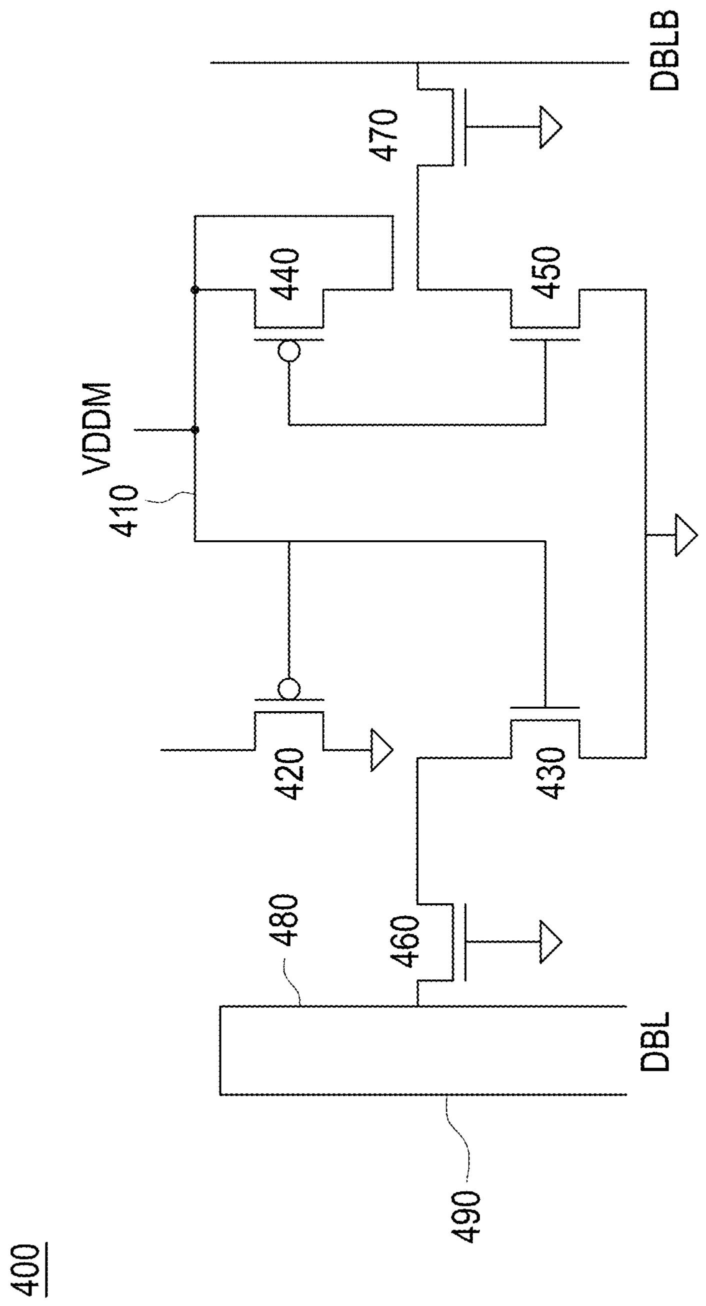
FIG. 4 is a schematic diagram illustrating an exemplary dummy bit cell of a semiconductor device in accordance with various embodiments of the present disclosure.

Example supporting circuitry for the dummy bit cell 400 are depicted in FIG. 4. It is understood that these circuitry are provided by way of example, not by limitation, and other suitable dummy bit cell 400 circuitry are within the scope of the present disclosure. FIG. 4 is a schematic diagram illustrating an exemplary dummy bit cell 400 of the semiconductor device 100 in accordance with various embodiments of the present disclosure. As illustrated in FIG. 4, the example dummy bit cell 400 is a 6T dummy bit cell. While a 6T dummy bit cell 400 is shown in this example, other types of dummy bit cells such as an 8T, 10T, or others may be used in other examples. The example dummy bit cell 400 includes a supply voltage node 410 configured to receive the supply voltage (VDDM). A gate terminal of a P-type Metal-Oxide-Semiconductor (PMOS) transistor 420 and a gate terminal of an N-type MOS (NMOS) transistor 430 are connected to each other and to the supply voltage node 410. The PMOS transistor 420 has a first source/drain terminal that is floating and a second source/drain terminal that is connected to an electrical ground. A gate terminal of a PMOS transistor 440 and a gate terminal of an NMOS transistor 450 are connected to each other and are floating. The PMOS transistor 440 has source and drain terminals connected to each other and to the supply voltage node 410. A dummy bit line (DBL) is connected to a first source/drain terminal of the NMOS transistor 430 through a first pass device 460. A dummy complement bit line (DBLB) is connected to a first source/drain terminal of the NMOS transistor 450 through a second pass device 470. Second source/drain terminals of the NMOS transistors 430, 450 and gate terminals of the pass devices 460, 470 are connected to each other and to the electrical ground.

As illustrated in FIG. 4, the dummy bit line (DBL) has first and second end portions 480, 490. The first end portion 480 is connected to the output of the buffer circuit 280*a*-280*c*. The second end portion 490 is connected to the pre-chargers 240 of the memory array 130*b*-130*d* and thus to the input of the buffer circuit 250*b*, 260*a*, 260*b*. The dummy bit cell 400 may, for example, be configured to mimic the resistive-capacitive (RC) delay caused by the bit cell 300. Therefore, the dummy bit cell 400 causes further delay in the pre-charging of the bit lines and complement bit lines, e.g., between memory arrays 130*a*, 130*b*, between memory arrays 130*b*, 130*c*, and between memory arrays 130*c*, 130*d*.

Figure 5:
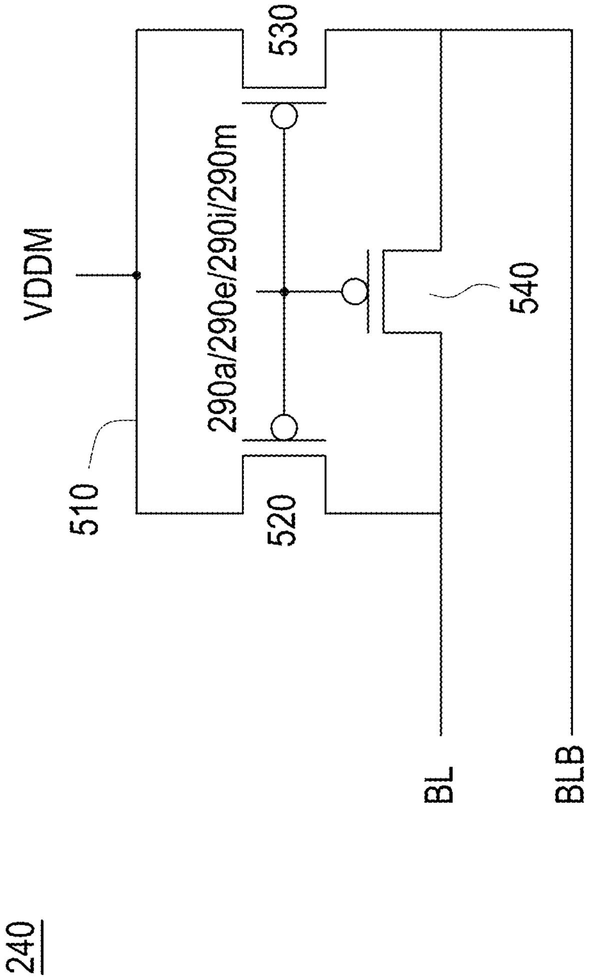
FIG. 5 is a schematic diagram illustrating an exemplary pre-charger of a semiconductor device in accordance with various embodiments of the present disclosure.

Example supporting circuitry for the pre-charger 240 are depicted in FIG. 5. It is understood that these circuitry are provided by way of example, not by limitation, and other suitable pre-charger 240 circuitry are within the scope of the present disclosure. FIG. 5 is a schematic diagram illustrating an exemplary pre-charger 240 of the semiconductor device 100 in accordance with various embodiments of the present disclosure. As illustrated in FIG. 5, the example pre-charger 240 includes a supply voltage node 510 configured to receive the supply voltage (VDDM). The supply voltage node 510 is connected to first source/drain terminals of PMOS transistors 520, 530. A second source/drain terminal of the PMOS transistor 520 and a first source/drain terminal of a PMOS transistor 540 are connected to each other and to the bit line (BL). A second source/drain terminal of the PMOS transistor 530 and a second source/drain terminal of the PMOS transistor 540 are connected to each other and to the complement bit line (BLB). The gate terminals of the PMOS transistors 520-540 of the pre-charger 240 of the memory array 130*a* are connected to each other and to the local controller 280. The gate terminals of the PMOS transistors 520-540 of the pre-charger 240 of the memory array 130*b*-130*d* are connected to each other and to the dummy bit line (DBL).

From the above, when a low logic level is asserted to the gate terminals of the PMOS transistors 520-540, the PMOS transistors 520-540 are activated. This connects the bit line (BL) and the complement bit line (BLB) to the supply voltage node 510, whereby the bit lines (BL0-BLn) and the complement bit lines (BLB0-BLBn) are pre-charged to the supply voltage (VDDM).

Figure 6:
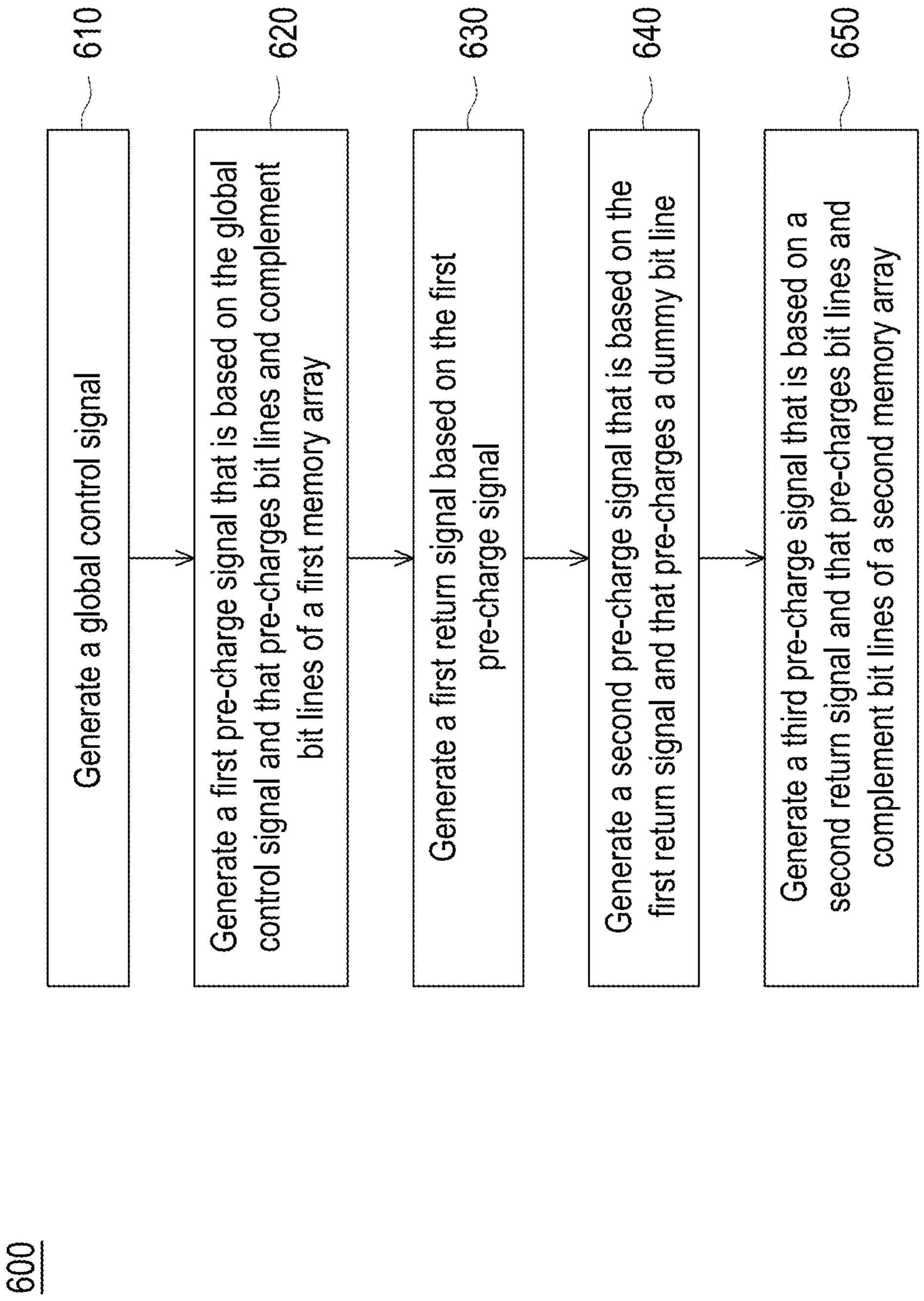
FIG. 6 is a flow chart illustrating an exemplary method of operating a semiconductor device in accordance with various embodiments of the present disclosure.

FIG. 6 is a flow chart illustrating an exemplary method 600 of operating the semiconductor device 100 in accordance with various embodiments of the present disclosure. Method 600 will now be described with further reference to FIGS. 2-5 for ease of understanding. It is understood that method 600 is applicable to structures other than those of FIGS. 2-5. Further, it is understood that additional operations can be provided before, during, and after method 600, and some of the operations described below can be replaced or eliminated, in an alternative embodiment of method 600.

In operation 610, with reference to FIG. 2, during transition of the semiconductor device 100 from a SD/DSLP mode to a wake-up mode, the global control circuit 120 receives a SD/DSLP signal that has, e.g., a low logic level, and in response thereto, generates a global control signal 220*a* that transitions, e.g., from a high logic level to a low logic level.

In operation 620, with reference to FIG. 2, the local controller 280 generates a first pre-charge signal 290*a* that is based on the global control signal 220*a*. For example, the logic level transition in the global control signal 220*a* causes a corresponding logic level transition in the first pre-charge signal 290*a*. The first pre-charge signal 290*a* pre-charges the bit lines (BL0-BLn) and the complement bit lines (BLB0-BLBn) of the memory array 130*a*. For example, with further reference to FIG. 5, the first pre-charge signal 290*a* is asserted to the gate terminals of the PMOS transistors 520-540 of the pre-charger 240 of the memory array 130*a*. This activates the PMOS transistors 520-540. This, in turn, connects the supply voltage node 510 to the bit line (BL) and the complement bit line (BLB), whereby the bit lines (BL0-BLn) and the complement bit lines (BLB0-BLBn) of the memory array 130*a* are pre-charged to the supply voltage (VDDM). In an alternative embodiment, the bit lines (BL0-BLn) and the complement bit lines (BLB0-BLBn) of the memory array 130*a* are pre-charged to a fraction of the supply voltage (VDDM).

In operation 630, with reference to FIG. 2, the buffer circuit 250*a* receives at the input thereof the first pre-charge signal 290*a* and generates at the output thereof a first return signal 290*b* based on the first pre-charge signal 290*a*. For example, the logic level transition in the first pre-charge signal 290*a* causes a corresponding logic level transition in the first return signal 290*b*. Therefore, the buffer circuit 250*a* causes a delay in the pre-charging of the bit lines (BL0-BLn) and the complement bit lines (BLB0-BLBn) between the memory arrays 130*a*, 130*b*.

In operation 640, with reference to FIG. 2, the buffer circuit 280*a* receives at the input thereof the first return signal 290*b* and generates at the output thereof a second pre-charge signal 290*c* that is based on the first return signal 290*b*. For example, the logic level transition in the first return signal 290*b* causes a corresponding logic level transition in the second pre-charge signal 290*c*. Therefore, the buffer circuit 280*a* causes a further delay in the pre-charging of the bit lines (BL0-BLn) and the complement bit lines (BLB0-BLBn) between the memory arrays 130*a*, 130*b*.

The second pre-charge signal 290*c* pre-charges the dummy bit line of the memory array 130*b*. For example, with further reference to FIG. 4, the second pre-charge signal 290*c* passes through or tracks the first end portion 480 of the dummy bit line (DBL) and a second return signal 290*d* is generated that is based on the second pre-charge signal 290*c* and that passes through or tracks the second end portion 490 of the dummy bit line (DBL). The logic level transition in the second pre-charge signal 290*c* causes a corresponding logic level transition in the second return signal 290*d*. Therefore, the dummy bit line circuit 270 of the memory array 130*b* causes a further delay in the pre-charging of the bit lines (BL0-BLn) and the complement bit lines (BLB0-BLBn) between the memory arrays 130*a*, 130*b*.

In operation 650, with reference to FIG. 2, a third pre-charge signal 290*e* is generated that is based on the second return signal 290*d*. For example, the logic level transition in the second return signal 290*d* causes a corresponding logic level transition in the third pre-charge signal 290*e*. The third pre-charge signal 290*e* pre-charges the bit lines (BL0-BLn) and the complement bit lines (BLB0-BLBn) of the memory array 130*b*. For example, with further reference to FIG. 5, the third pre-charge signal 290*e* is asserted to the gate terminals of the PMOS transistors 520-540 of the pre-charger 240 of the memory array 130*b*. This activates the PMOS transistors 520-540. This, in turn, connects the supply voltage node 510 to the bit line (BL) and the complement bit line (BLB), whereby the bit lines (BL0-BLn) and the complement bit lines (BLB0-BLBn) of the memory array 130*b* are pre-charged to the supply voltage (VDDM). In an alternative embodiment, the bit lines (BL0-BLn) and the complement bit lines (BLB0-BLBn) of the memory array 130*b* are pre-charged to a fraction of the supply voltage (VDDM).

From the above, the total delay between pre-charging the bit lines (BL0-BLn) and the complement bit lines (BLB0-BLBn) of the memory array 130*a* and pre-charging the bit lines (BL0-BLn) and the complement bit lines (BLB0-BLBn) of the memory array 130*b*, i.e., the total delay between the first and third pre-charge signals 290*a*, 290*e*, is substantially equal to a buffer delay of the buffer circuit 250*a*, the RC delay of the first return signal 290*b* caused by the memory array 130*a*, a buffer delay of the buffer circuit 280*a*, and the pre-charging delay of the dummy bit line circuit 270 of the memory array 130*b*. Such a total delay permits completion or substantial completion of pre-charging the bit lines and the complement bit lines of the memory array 130*a* prior to pre-charging the bit lines and the complement bit lines of the memory array 130*b*. For example, because the third pre-charge signal 290*e* begins a logic level transition only after the logic level transition of the first pre-charge signal 290*a*, there is a delay in the pre-charging of the bit lines (BL0-BLn) and the complement bit lines (BLB0-BLBn) between the memory arrays 130*a*, 130*b*.

Subsequent to operation 650, the buffer circuit 250*b* receives at the input thereof the third pre-charge signal 290*e* and generates at the output thereof a third return signal 290*f* based on the third pre-charge signal 290*e*. For example, the logic level transition in the third pre-charge signal 290*e* causes a corresponding logic level transition in the third return signal 290*f*. Therefore, the buffer circuit 250*b* causes a delay in the pre-charging of the bit lines (BL0-BLn) and the complement bit lines (BLB0-BLBn) between the memory arrays 130*b*, 130*c*.

Next, the buffer circuit 280*b* receives at the input thereof the third return signal 290*f* and generates at the output thereof a fourth pre-charge signal 290*g* that is based on the third return signal 290*f*. For example, the logic level transition in the third return signal 290*f* causes a corresponding logic level transition in the fourth pre-charge signal 290*g*. Therefore, the buffer circuit 280*b* causes a further delay in the pre-charging of the bit lines (BL0-BLn) and the complement bit lines (BLB0-BLBn) between the memory arrays 130*b*, 130*c*.

The fourth pre-charge signal 290*g* pre-charges the dummy bit line of the memory array 130*c*. For example, with further reference to FIG. 4, the fourth pre-charge signal 290*g* passes through or tracks the first end portion 480 of the dummy bit line (DBL) and a fourth return signal 290*h* is generated that is based on the fourth pre-charge signal 290*g* and that passes through or tracks the second end portion 490 of the dummy bit line (DBL). The logic level transition in the fourth pre-charge signal 290*g* causes a corresponding logic level transition in the fourth return signal 290*h*. Therefore, the dummy bit line circuit 270 of the memory array 130*c* causes a further delay in the pre-charging of the bit lines (BL0-BLn) and the complement bit lines (BLB0-BLBn) between the memory arrays 130*b*, 130*c*.

Next, a fifth pre-charge signal 290*i* is generated that is based on the fourth return signal 290*h*. For example, the logic level transition in the fourth return signal 290*h* causes a corresponding logic level transition in the fifth pre-charge signal 290*i*. The fifth pre-charge signal 290*i* pre-charges the bit lines and the complement bit lines of the memory array 130*c*. For example, the fifth pre-charge signal 290*i* is asserted to the gate terminals of the PMOS transistors 520-540 of the pre-charger 140 of the memory array 130*c*. This activates the PMOS transistors 520-540. This, in turn, connects the supply voltage node 510 to the bit line and the complement bit line, whereby the bit lines (BL0-BLn) and the complement bit lines (BLB0-BLBn) of the memory array 130*c* are pre-charged to the supply voltage (VDDM). In an alternative embodiment, the bit lines (BL0-BLn) and the complement bit lines (BLB0-BLBn) of the memory array 130*c* are pre-charged to a fraction of the supply voltage (VDDM).

From the above, the total delay between pre-charging the bit lines and the complement bit lines of the memory array 130*b* and pre-charging the bit lines and the complement bit lines of the memory array 130*c*, i.e., the total delay between the third and fifth pre-charge signals 290*e*, 290*i*, is substantially equal to a buffer delay of the buffer circuit 250*b*, the RC delay of the third return signal 290*f* caused by the memory array 130*b*, a buffer delay of the buffer circuit 280*b*, and the pre-charging delay of the dummy bit line of the memory array 130*c*. Such a total delay permits completion or substantial completion of pre-charging the bit lines and the complement bit lines of the memory array 130*b* prior to pre-charging the bit lines and the complement bit lines of the memory array 130*c*. For example, because the fifth pre-charge signal 290*i* begins a logic level transition only after the logic level transition of the third pre-charge signal 290*e*, there is a delay in the pre-charging of the bit lines (BL0-BLn) and the complement bit lines (BLB0-BLBn) between the memory arrays 130*b*, 130*c*.

Subsequent to pre-charging the bit lines and the complement bit lines of the memory array 130*c*, the buffer circuit 260*a* receives at the input thereof the fifth pre-charge signal 290*i* and generates at the output thereof a fifth return signal 290*j* based on the fifth pre-charge signal 290*i*. For example, the logic level transition in the fifth pre-charge signal 290*i* causes a corresponding logic level transition in the fifth return signal 290*j*. Therefore, the buffer circuit 260*a* causes a delay in the pre-charging of the bit lines (BL0-BLn) and the complement bit lines (BLB0-BLBn) between the memory arrays 130*c*, 130*d*.

Next, the buffer circuit 280*c* receives at the input thereof the fifth return signal 290*j* and generates at the output thereof a sixth pre-charge signal 290*k* that is based on the fifth return signal 290*j*. For example, the logic level transition in the fifth return signal 290*j* causes a corresponding logic level transition in the sixth pre-charge signal 290*k*. Therefore, the buffer circuit 280*b* causes a further delay in the pre-charging of the bit lines (BL0-BLn) and the complement bit lines (BLB0-BLBn) between the memory arrays 130*c*, 130*d*.

The sixth pre-charge signal 290*k* pre-charges the dummy bit line of the memory array 130*d*. For example, with further reference to FIG. 4, the sixth pre-charge signal 290*k* passes through or tracks the first end portion 480 of the dummy bit line (DBL) and a sixth return signal 290*l* is generated that is based on the sixth pre-charge signal 290*k* and that passes through or tracks the second end portion 490 of the dummy bit line (DBL). The logic level transition in the sixth pre-charge signal 290*k* causes a corresponding logic level transition in the six return signal 290*l*. Therefore, the dummy bit line circuit 270 of the memory array 130*d* causes a further delay in the pre-charging of the bit lines (BL0-BLn) and the complement bit lines (BLB0-BLBn) between the memory arrays 130*c*, 130*d*.

Next, a seventh pre-charge signal 290*m* is generated that is based on the sixth return signal 290*l*. For example, the logic level transition in the sixth return signal 290*l* causes a corresponding logic level transition in the seventh pre-charge signal 290*m*. The seventh pre-charge signal 290*m* pre-charges the bit lines and the complement bit lines of the memory array 130*d*. For example, with further reference to FIG. 5, the seventh pre-charge signal 290*m* is asserted to the gate terminals of the PMOS transistors 520-540 of the pre-charger 240 of the memory array 130*d*. This activates the PMOS transistors 520-540. This, in turn, connects the supply voltage node 510 to the bit line and the complement bit line, whereby the bit lines (BL0-BLn) and the complement bit lines (BLB0-BLBn) of the memory array 130*d* are pre-charged to the supply voltage (VDDM). In an alternative embodiment, the bit lines (BL0-BLn) and the complement bit lines (BLB0-BLBn) of the memory array 130*d* are pre-charged to a fraction of the supply voltage (VDDM).

From the above, the total delay between pre-charging the bit lines and the complement bit lines of the memory array 130*c* and pre-charging the bit lines and the complement bit lines of the memory array 130*d*, i.e., the total delay between the fifth and seventh pre-charge signals 290*i*, 290*m*, is substantially equal to a buffer delay of the buffer circuit 260*a*, the RC delay of the fifth return signal 290*j* caused by the memory array 130*c*, a buffer delay of the buffer circuit 280*c*, and the pre-charging delay of the dummy bit line of the memory array 130*c*. Such a total delay permits completion or substantial completion of pre-charging the bit lines and the complement bit lines of the memory array 130*c* prior to pre-charging the bit lines and the complement bit lines of the memory array 130*d*. For example, because the seventh pre-charge signal 290*m* begins a logic level transition only after the logic level transition of the fifth pre-charge signals 290*i*, there is a delay in the pre-charging of the bit lines (BL0-BLn) and the complement bit lines (BLB0-BLBn) between the memory arrays 130*b*, 130*c*.

Subsequent to pre-charging the bit lines and the complement bit lines of the memory array 130*d*, the buffer circuit 260*b* receives at the input thereof the seventh pre-charge signal 290*m* and generates at the output thereof a seventh return signal 290*n* based on the seventh pre-charge signal 290*m*. For example, the logic level transition in the seventh pre-charge signal 290*m* causes a corresponding logic level transition in the seventh return signal 290*n*.

Thereafter, the buffer circuit 280*d* receives at the input thereof the seventh return signal 290*n* and generates at the output thereof a local control signal 210*a* that is based on the seventh return signal 290*n*. For example, the logic level transition in the seventh return signal 290*n* causes a corresponding logic level transition in the local control signal 210*a*. The local control signal 210*a* pre-charges the bit lines and the complement bit lines of another memory bank.

Figure 7:
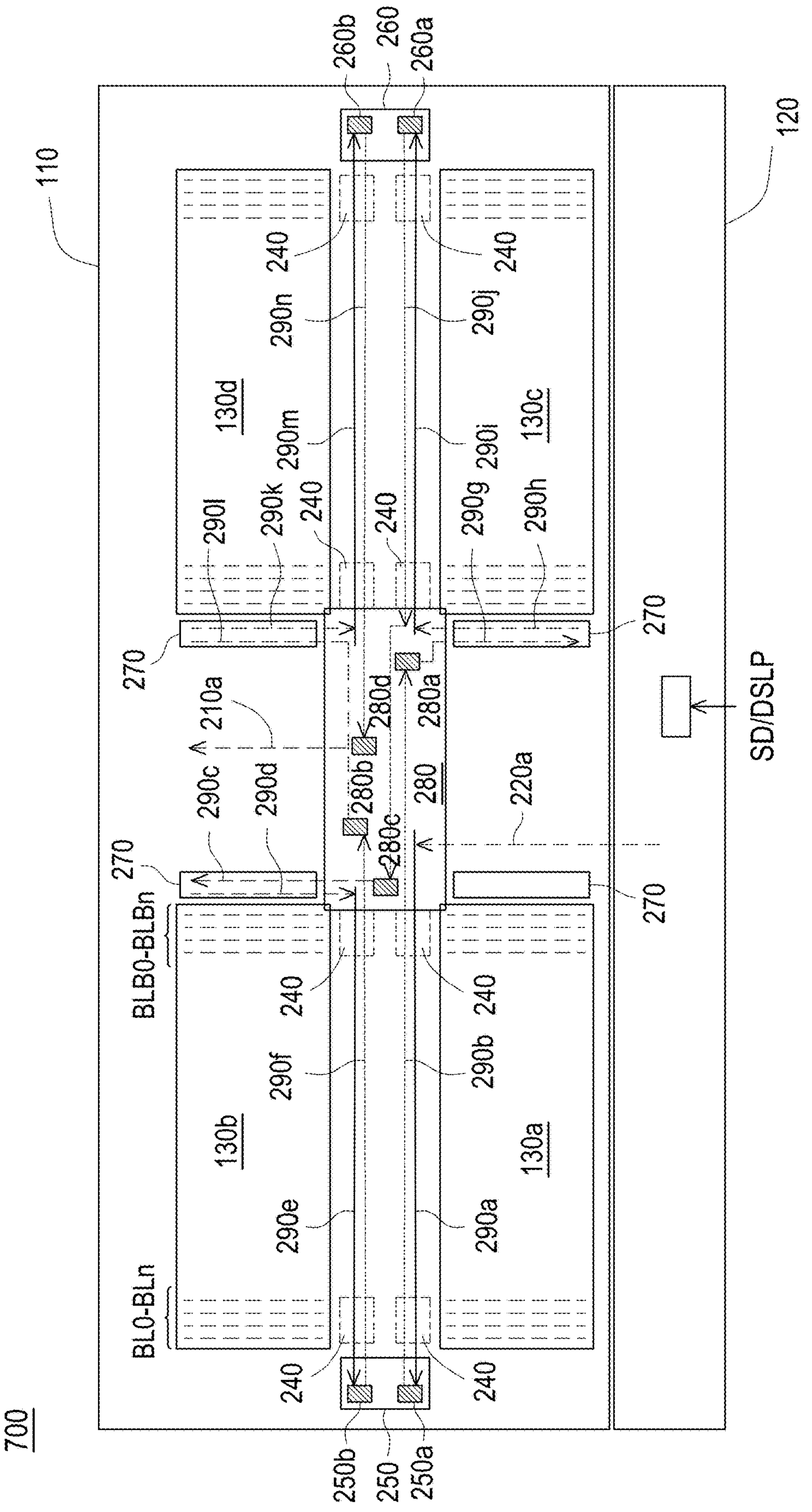
FIG. 7 is a schematic diagram illustrating another exemplary semiconductor device in accordance with various embodiments of the present disclosure.

Although the semiconductor device 100 is exemplified such that the bit lines (BL0-BLn) and the complement bit lines (BLB0-BLBn) are pre-charged in order starting from the memory array 130*a* to the memory array 130*d*, it is understood that, after reading this disclosure, the sequence of pre-charging the bit lines and the complement bit lines of the memory arrays 130*a*-130*d* may be performed in a different order. For example, FIG. 7 is a schematic diagram illustrating another exemplary semiconductor device 700 in accordance with various embodiments of the present disclosure. As illustrated in FIG. 7, the semiconductor device 700 differs from the semiconductor device 100 in that the bit lines (BL0-BLn) and the complement bit lines (BLB0-BLBn) are pre-charged in order of memory arrays 130*a*, 130*c*, 130*b*, and 130*d*. In some embodiments, the bit lines (BL0-BLn) and the complement bit lines (BLB0-BLBn) are pre-charged in order of memory arrays 130*c*, 130*d*, 130*a*, and 130*b*. In other embodiments, the bit lines (BL0-BLn) and the complement bit lines (BLB0-BLBn) are pre-charged in order of memory arrays 130*c*, 130*a*, 130*d*, and 130*b*.

It has thus been shown that the semiconductor device 100, 700 of the present disclosure comprises one or more memory banks, e.g., memory bank 110, that includes a plurality of memory arrays, e.g., memory arrays 130*a*-130*d*. Each memory array 130*a*-130*d* includes a plurality of bit cells, e.g., bit cell 300, that store bits of information. The bit cells 300 may be arranged in an array of rows and columns. The bit cells 300 in each column are connected between a respective bit line (BL0-BLn) and a respective complement bit line (BLB0-BLBn). The bit lines (BL0-BLn) and the complement bit lines (BLB0-BLBn) are pre-charged one memory array at a time, whereby the semiconductor device 100, 700 of the present disclosure generates a peak current lower than (e.g., less than 50%) a peak current generated by a conventional semiconductor device (in which the bit lines and complement bit lines of all the memory arrays are pre-charged at the same time or at substantially the same time), during transition thereof from a SD/DSLP mode to a wake-up mode.

Figure 8:
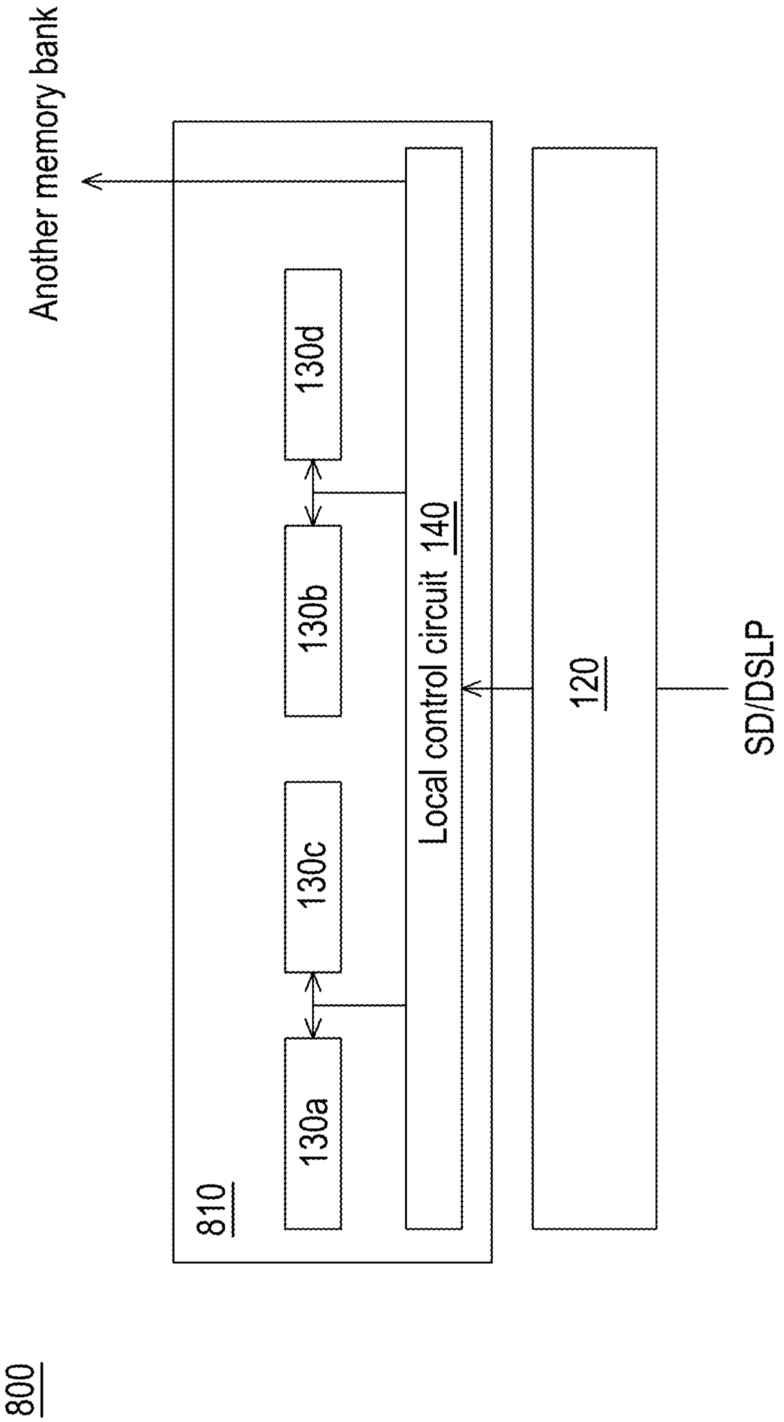
FIG. 8 is a schematic diagram illustrating another exemplary semiconductor device in accordance with various embodiments of the present disclosure.

FIG. 8 is a schematic diagram illustrating another exemplary semiconductor device 800 in accordance with various embodiments of the present disclosure. As illustrated in FIG. 8, the semiconductor device 800, e.g., a SPMB memory device or any suitable memory device, includes a plurality of memory banks 810 (only one of the memory banks 810 is shown in FIG. 8) and a global control circuit 120. The memory banks 810 and the global control circuit 120 constitute a memory macro.

The memory bank 810 includes a plurality of memory arrays 130*a*-130*d*, e.g., SRAM arrays, DRAM arrays, or any suitable memory arrays. Each memory array 130*a*-130*d* includes a plurality of bit cells that store bits of information. In one or more embodiments, the bit cells are arranged in an array of rows and columns. In such one or more embodiments, the bit cells in each column are connected between a respective bit line and a respective complement bit line.

The memory bank 810 further includes a local control circuit configured to pre-charge the bit lines and the complement bit lines two memory arrays at a time. For example, during transition of the semiconductor device 800 from a SD/DSLP mode to a wake-up mode, the global control circuit 120 receives a SD/DSLP signal that has, e.g., a low logic level, and in response thereto, generates a global control signal that transitions from a high logic level to a low logic level. The local control circuit 140 generates a pre-charge signal that is based on the global control signal. For example, the logic level transition in the global control signal causes a corresponding logic level transition in the pre-charge signal. The pre-charge signal pre-charges the bit lines and the complement bit lines of the memory arrays 130*a*-130*d*. The local control circuit 140 introduces delays to the pre-charge signal such that pre-charging of the bit lines and the complement bit lines of the memory arrays 130*a* and 130*c* is completed or substantially completed prior to pre-charging of the bit lines and the complement bit lines of the memory array 130*b* and 130*d*. In this way, the bit lines and complement bit lines are pre-charged two memory arrays at a time and whereby the semiconductor device 100 of the present disclosure generates a peak current lower than a peak current generated by a conventional semiconductor device (in which the bit lines and complement bit lines of all the memory arrays are pre-charged at the same time or substantially at the same time), during transition thereof from a SD/DSLP mode to a wake-up mode.

Figure 9:
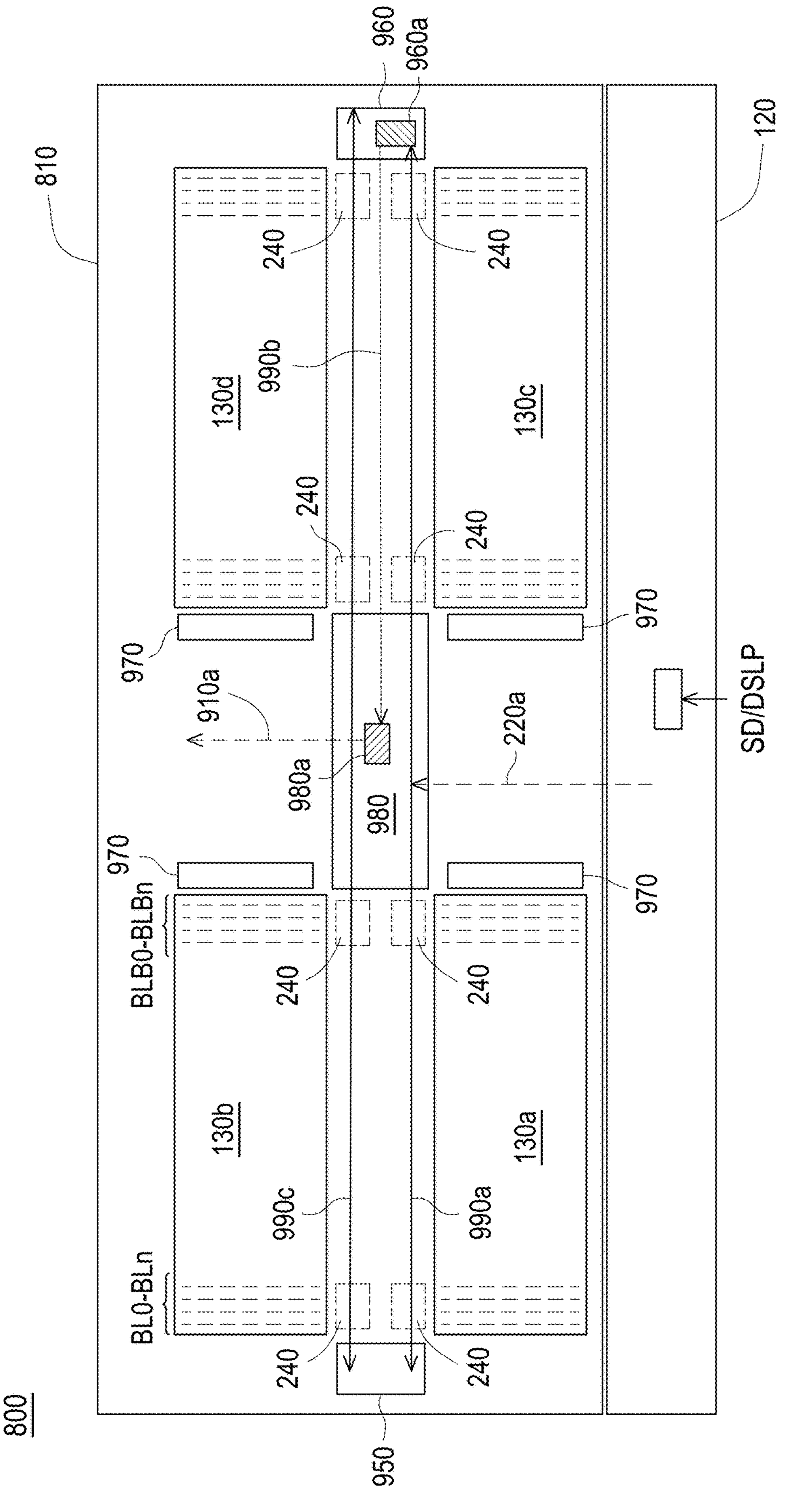
FIG. 9 is a schematic diagram illustrating the semiconductor device of FIG. 8 in accordance with various embodiments of the present disclosure.

FIG. 9 is a schematic diagram illustrating the semiconductor device 800 in accordance with various embodiments of the present disclosure. As illustrated in FIG. 9, the semiconductor device 800, e.g., a SPMB memory device or any memory device, includes a plurality of memory banks 810 (only one of the memory banks 810 is shown in FIG. 9) and a global control circuit 120. In an alternative embodiment, the semiconductor device 800 includes a single memory bank. The memory bank 810 includes a plurality of memory arrays (e.g., memory array 130*a*, memory array 130*b* above the memory array 130*a*, memory array 130*c* at the right side of the memory array 130*a*, and memory array 130*d* above the memory array 130*c* and at the right side of the memory array 130*b*). Each memory array 130*a*-130*d* includes a plurality of bit cells, e.g., bit cell 300 of FIG. 3, that store bits of information. In one or more embodiments, the bit cells 300 are arranged in an array of rows and columns. In such one or more embodiments, the bit cells 300 in each column are connected between a respective bit line (BL0-BLn) and a respective complement bit line (BLB0-BLBn).

Although the memory bank 810 is exemplified with four memory arrays 130*a*-130*d*, it is understood that, after reading this disclosure, the number of memory arrays of the memory bank 810 may be increased or decreased.

The memory bank 810 further includes a plurality of pre-chargers 240. Each pre-charger 240 is connected between a respective bit line (BL0-BLn) and a respective complement bit line (BLB0-BLBn). The pre-charger 240 is configured to pre-charge the bit line (BL0-BLn) and the complement bit line (BLB0-BLBn), e.g., to a supply voltage or a fraction of the supply voltage, thereby improving read/write access to the bit cells 300.

As illustrated in FIG. 9, the memory bank 810 further includes a plurality of dummy bit cell circuit 970. Each dummy bit cell circuit 970 is adjacent a respective memory array 130*a*-130*d* and is connected between a respective dummy bit line and a respective dummy complement bit line. In this exemplary embodiment, the dummy bit line of the memory array 130*a*-130*d* is not connected to the pre-chargers 240 of the memory array 130*a*-130*d*.

The memory bank 810 further includes a local control circuit that has a left local input/output (I/O) edge 950 and a right local I/O edge 960 and a local controller 980 between the left and right local I/O edges 950, 960. The left and right local I/O edges 950, 960 isolate the local control circuit from auxiliary circuitry of the semiconductor device 800 outside the memory macro. In this exemplary embodiment, one of the left and right local I/O edges 950, 960, e.g., the right local I/O edge 960, is formed with a buffer circuit 960*a*. In some embodiments, the buffer circuit 960*a* is in the form of a pair of inverters connected in series. Other configurations for the buffer circuit 960*a* are contemplated in further embodiments. The input of the buffer circuit 960*a* is connected to the pre-chargers 240 of the memory arrays 130*a*, 130*c*.

As illustrated in FIG. 9, the local controller 980 is connected to the pre-chargers 240 of the memory arrays 130*a*, 130*c*. In this exemplary embodiment, the local controller 980 is formed with a buffer circuit 980*a*. In some embodiments, the buffer circuit 980*a* is in the form of a pair of inverters connected in series. Other configuration for the buffer circuit 980*a* are contemplated in further embodiments. The input of the buffer circuit 980*a* is connected to the output of the buffer circuit 960*a*. The output of the buffer circuit 980*a* is connected to the pre-chargers 240 of the memory arrays 130*b*, 130*d*, the local controller 980, and another memory bank.

The global control circuit 120 controls reading from and writing to the bit cells 300. During transition of the semiconductor device 800 from a SD/DSLP mode to a wake-up mode, the global control circuit 120 receives, e.g., a low logic level SD/DSLP signal, and in response thereto, generates a global control signal 220*a* that pre-charges the bit lines (BL0-BLn) and the complement bit lines (BLB0-BLBn) of the memory bank 810, in a manner that will be described hereinafter.

Figure 10:
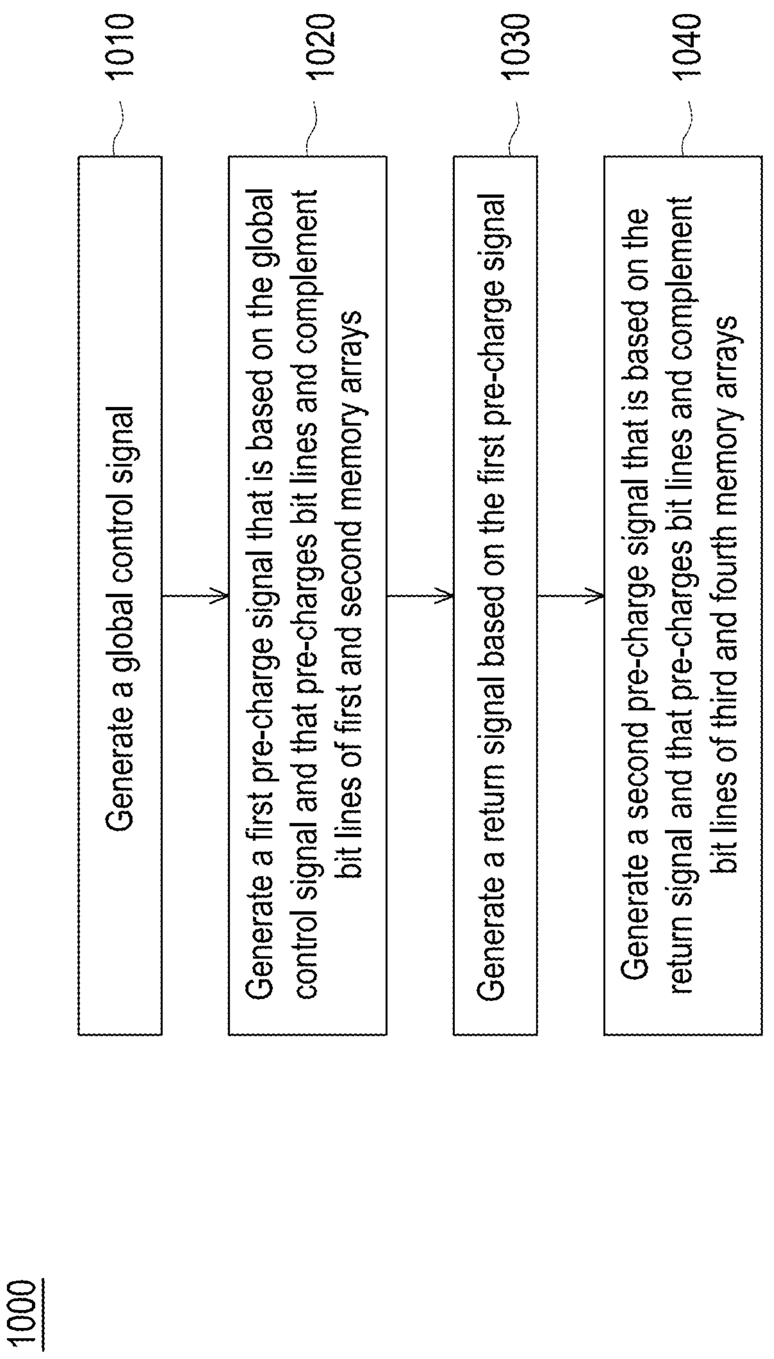
FIG. 10 is a flow chart illustrating another exemplary method of operating a semiconductor device in accordance with various embodiments of the present disclosure.

FIG. 10 is a flow chart illustrating an exemplary method 1000 of operating the semiconductor device 800 in accordance with various embodiments of the present disclosure. Method 1000 will now be described with further reference to FIGS. 3-5 and 9 for ease of understanding. It is understood that method 1000 is applicable to structures other than those of FIGS. 3-5 and 9. Further, it is understood that additional operations can be provided before, during, and after method 1000, and some of the operations described below can be replaced or eliminated, in an alternative embodiment of method 1000.

In operation 1010, with reference to FIG. 9, during transition of the semiconductor device 800 from a SD/DSLP mode to a wake-up mode, the global control circuit 120 receives a SD/DSLP signal that has, e.g., a low logic level, and in response thereto, generates a global control signal 220*a* that transitions, e.g., from a high logic level to a low logic level.

In operation 1020, with reference to FIG. 9, the local controller 980 generates a first pre-charge signal 990*a* that is based on the global control signal 220*a*. For example, the logic level transition in the global control signal 220*a* causes a corresponding logic level transition in the first pre-charge signal 990*a*. The first pre-charge signal 990*a* pre-charges the bit lines (BL0-BLn) and the complement bit lines (BLB0-BLBn) of the memory arrays 130*a*, 130*c* at the same time. For example, with further reference to FIG. 5, the first pre-charge signal 990*a* is asserted to the gate terminals of the PMOS transistors 520-540 of the pre-chargers 240 of the memory arrays 130*a*, 130*c*. This activates the PMOS transistors 520-540. This, in turn, connects the supply voltage node 510 to the bit line (BL0-BLn) and the complement bit line (BLB0-BLBn), whereby the bit lines (BL0-BLn) and the complement bit lines (BLB0-BLBn) of the memory arrays 130*a*, 130*c* are pre-charged to the supply voltage (VDDM). In an alternative embodiment, the bit lines (BL0-BLn) and the complement bit lines (BLB0-BLBn) of the memory arrays 130*a*, 130*c* are pre-charged to a fraction of the supply voltage (VDDM).

In operation 1030, with reference to FIG. 9, the buffer circuit 960*a* receives at the input thereof the first pre-charge signal 990*a* and generates at the output thereof a return signal 990*b* based on the first pre-charge signal 990*a*. For example, the logic level transition in the first pre-charge signal 990*a* causes a corresponding logic level transition in the return signal 990*b*.

In operation 1040, with reference to FIG. 9, the buffer circuit 980*a* receives at the input thereof the return signal 990*b* and generates at the output thereof a second pre-charge signal 990*c* that is based on the return signal 990*b*. For example, the logic level transition in the return signal 990*b* causes a corresponding logic level transition in the second pre-charge signal 990*c*. The second pre-charge signal 990*c* pre-charges the bit lines (BL0-BLn) and the complement bit lines (BLB0-BLBn) of the memory arrays 130*b*, 130*d* at the same time. For example, with further reference to FIG. 5, the second pre-charge signal 990*c* is asserted to the gate terminals of the PMOS transistors 520-540 of the pre-charger 140 of the memory arrays 130*b*, 130*d*. This activates the PMOS transistors 520-540. This, in turn, connects the supply voltage node 510 to the bit line and the complement bit line, whereby the bit lines (BL0-BLn) and the complement bit lines (BLB0-BLBn) of the memory arrays 130*b*, 130*d* are pre-charged to the supply voltage (VDDM). In an alternative embodiment, the bit lines (BL0-BLn) and the complement bit lines (BLB0-BLBn) of the memory arrays 130*b*, 130*d* are pre-charged to a fraction of the supply voltage (VDDM).

From the above, the total delay between pre-charging the bit lines (BL0-BLn) and the complement bit lines (BLB0-BLBn) of the memory arrays 130*a*, 130*c* and pre-charging the bit lines (BL0-BLn) and the complement bit lines (BLB0-BLBn) of the memory arrays 130*b*, 130*d*, i.e., the total delay between the first and second pre-charge signals 990*a*, 990*c*, is substantially equal to a buffer delay of the buffer circuit 960*a*, the RC delay of the return signal 990*b* caused by the memory arrays 130*a*, 130*c*, and the buffer delay of the buffer circuit 980*a*. Such a total delay permits completion or substantial completion of pre-charging the bit lines (BL0-BLn) and the complement bit lines (BLB0-BLBn) of the memory arrays 130*a*, 130*c* prior to pre-charging the bit lines (BL0-BLn) and the complement bit lines (BLB0-BLBn) of the memory arrays 130*b*, 130*d*. For example, the second pre-charge signal 990*c* begins a logic level transition only after the logic level transition of the first pre-charge signal 990*a*.

At substantially the same time as operation 1040, the local controller 980 generates a local control signal 910*a* that is based on the return signal 990*b*. For example, the logic level transition in the return signal 990*b* causes a corresponding logic level transition in the local control signal 910*a*. The local control signal 910*a* pre-charges the bit lines and the complement bit lines of another memory bank.

In an embodiment, a semiconductor device comprises a memory bank. The memory bank includes a plurality N of memory arrays and a local control circuit. Each memory array includes a plurality of bit cells configured to store bits of information and connected between a plurality of bit lines and a plurality of complement bit lines. The local control circuit is configured to pre-charge the bit lines and the complement bit lines at most N−1 memory arrays at a time.

In another embodiment, a semiconductor device comprises a memory bank. The memory bank includes a plurality of memory arrays, a dummy bit cell, and a local control circuit. Each memory array includes a bit cell configured to store a bit of information and connected between a bit line and a complement bit line. The dummy bit cell is connected between a dummy bit line and a dummy complement bit line. The local control circuit is configured to pre-charge the bit lines and the complement bit lines. The local control circuit is further configured to pre-charge the dummy bit line.

In another embodiment, a method of operating a semiconductor device comprises pre-charging a bit line and a complement bit line of a first memory array of a memory bank, pre-charging a bit line and a complement bit line of a second memory array of the memory bank, and after pre-charging the bit line and the complement bit line of the first memory array and prior to pre-charging the bit line and the complement bit line of the second memory array, pre-charging a dummy bit line of the second memory array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a plurality of memory arrays, each having a bit line and a complement bit line;

a pre-charger configured to pre-charge the bit line and the complement bit line;

a first buffer circuit having an input connected to the pre-charger; and a second buffer circuit having an input connected to an output of the first buffer circuit, wherein the first and second buffer circuits are disposed in a pre-charge signal path between a first memory array and a second memory array of the plurality of memory arrays, such that pre-charging of the bit line and the complement bit line of the first memory array is substantially completed prior to pre-charging of the bit line and the complement bit line of the second memory array.

2. The semiconductor device of claim 1, further comprising a dummy bit cell connected between a dummy bit line and a dummy complement bit line, wherein the dummy bit line is connected to the pre-charger.

3. The semiconductor device of claim 1, wherein the first buffer circuit is configured to delay pre-charging of the bit line and the complement bit line between the first and second memory arrays of the plurality of memory arrays.

4. The semiconductor device of claim 1, further comprising a control circuit having a local input/output (I/O) edge formed with the first buffer circuit.

5. The semiconductor device of claim 1, wherein the second buffer circuit is configured to delay pre-charging of the bit line and the complement bit line between the first and second memory arrays of the plurality of memory arrays.

6. The semiconductor device of claim 1, further comprising a control circuit having a local controller formed with the second buffer circuit.

7. The semiconductor device of claim 1, further comprising:

a dummy bit cell connected between a dummy bit line and a dummy complement bit line; and a buffer circuit having an output connected to the dummy bit line.

8. The semiconductor device of claim 1, further comprising a dummy bit cell connected between a dummy bit line and a dummy complement bit line, wherein the dummy bit cell includes a pair of transistors, each transistor has a gate terminal, and the gate terminals are connected to each other and to a supply voltage node.

9. A semiconductor device comprising:

a plurality of memory arrays, each having a bit line and a complement bit line;

a plurality of dummy bit cell circuits, each having a dummy bit line and a dummy complement bit line;

a pre-charger configured to pre-charge the bit line, the complement bit line, and the dummy bit line;

a first buffer circuit having an input connected to the pre-charger; and a second buffer circuit having an input connected to an output of the first buffer circuit, wherein the first and second buffer circuits are disposed in a pre-charge signal path between a first memory array and a second memory array of the plurality of memory arrays, such that pre-charging of the bit line and the complement bit line of the first memory array is substantially completed prior to pre-charging of the bit line and the complement bit line of the second memory array.

10. The semiconductor device of claim 9, wherein the pre-charger is connected between the bit line and the complement bit line, wherein the dummy bit line is connected to the pre-charger.

11. The semiconductor device of claim 9, wherein the first buffer circuit is configured to delay pre-charging of the bit line and the complement bit line between the first and second memory arrays of the plurality of memory arrays.

12. The semiconductor device of claim 9, wherein the control circuit has a local input/output (I/O) edge formed with the first buffer circuit.

13. The semiconductor device of claim 9, wherein the second buffer circuit is configured to delay pre-charging of the bit line and the complement bit line between the first and second memory arrays of the plurality of memory arrays.

14. The semiconductor device of claim 9, wherein the control circuit includes a local controller formed with the second buffer circuit.

15. A method of operating a semiconductor device, the method comprising:

pre-charging, by a pre-charger, a bit line and a complement bit line of a first memory array, wherein a first buffer circuit has an input connected to the pre-charger and a second buffer circuit has an input connected to an output of the first buffer circuit; and pre-charging, by the pre-charger, a bit line and a complement bit line of a second memory array, wherein the first and second buffer circuits are disposed in a pre-charge signal path between the first memory array and the second memory array, such that pre-charging of the bit line and the complement bit line of the first memory array is substantially completed prior to pre-charging of the bit line and the complement bit line of the second memory array.

16. The method of claim 15, wherein the second memory array is above or below the first memory array.

17. The method of claim 15, wherein the second memory array is at a right or left side of the first memory array.

18. The method of claim 15, further comprising pre-charging of a bit line and a complement bit line of the second memory array using the first and second buffer circuits.

19. The method of claim 18, further comprising:

pre-charging a bit line and a complement bit line of a third memory array; and after pre-charging the bit line and the complement bit line of the second memory array and prior to pre-charging the bit line and the complement bit line of the third memory array, pre-charging a dummy bit line of the third memory array.

20. The semiconductor device of claim 1, wherein:

the first buffer circuit is configured to receive a first pre-charge signal that pre-charges the bit line and the complement bit line of the first memory array and to generate a first return signal;

the second buffer circuit is configured to receive the first return signal and to generate a second pre-charge signal;

a dummy bit line circuit is configured to receive the second pre-charge signal and to generate a second return signal;

a third pre-charge signal is generated based on the second return signal and pre-charges the bit line and the complement bit line of the second memory array; and the first buffer circuit, the second buffer circuit, and the dummy bit line circuit are configured to cause a delay between the first pre-charge signal and the third pre-charge signal, such that pre-charging of the first memory array is substantially completed prior to pre-charging of the second memory array.

* * * * *